United States Patent
Wang et al.

(10) Patent No.: US 11,848,062 B2
(45) Date of Patent: Dec. 19, 2023

(54) VOLTAGE CONTROL METHOD AND VOLTAGE CONTROL CIRCUIT FOR ANTI-FUSE MEMORY ARRAY

(71) Applicant: NO.24 RESEARCH INSTITUTE OF CHINA ELECTRONICS TECHNOLOGY GROUP CORPORATION, Chongqing (CN)

(72) Inventors: Yan Wang, Chongqing (CN); Peijian Zhang, Chongqing (CN); Mingyuan Xu, Chongqing (CN); Xian Chen, Chongqing (CN); Feiyu Jiang, Chongqing (CN); Xiyi Liao, Chongqing (CN); Sheng Qiu, Chongqing (CN); Zhengyuan Zhang, Chongqing (CN); Ruzhang Li, Chongqing (CN); Hequan Jiang, Chongqing (CN); Yonghong Dai, Chongqing (CN)

(73) Assignee: NO.24 RESEARCH INSTITUTE OF CHINA ELECTRONICS TECHNOLOGY GROUP CORPORATION, Chongqing (CN)

(*) Notice: Subject to any disclaimer, the term of this patent is extended or adjusted under 35 U.S.C. 154(b) by 0 days.

(21) Appl. No.: 17/925,320

(22) PCT Filed: Sep. 1, 2020

(86) PCT No.: PCT/CN2020/112748
§ 371 (c)(1),
(2) Date: Nov. 15, 2022

(87) PCT Pub. No.: WO2022/007156
PCT Pub. Date: Jan. 13, 2022

(65) Prior Publication Data
US 2023/0197178 A1 Jun. 22, 2023

(30) Foreign Application Priority Data

Jul. 10, 2020 (CN) .......................... 202010661652.5

(51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ...................................................... G11C 17/18
(Continued)

(56) References Cited

U.S. PATENT DOCUMENTS

| | | | |
|---|---|---|---|
| 2006/0062051 A1* | 3/2006 | Bedeschi | G11C 13/0004 365/177 |
| 2007/0014183 A1* | 1/2007 | Shuto | G11C 16/0433 365/225.7 |

(Continued)

FOREIGN PATENT DOCUMENTS

| | | |
|---|---|---|
| CN | 101127244 A | 2/2008 |
| CN | 101944388 A | 1/2011 |
| CN | 102272854 A | 12/2011 |

*Primary Examiner* — Muna A Techane

(57) ABSTRACT

A voltage control method and a voltage control circuit for an anti-fuse memory array, including: obtaining a storage data address, dividing the storage data address into multiple subdata addresses, decoding each subdata address to obtain a corresponding group of decoder output signals, converting the corresponding group of decoder output signals into a group of control signals by a corresponding group of high voltage converters; connecting multiple groups of data selectors in series, outputting selection voltages input to each group of data selectors to an anti-fuse unit under the control of the corresponding group of control signals; programming or reading an anti-fuse unit; the selection voltages (Continued)

include one of a programming selection voltage, a reading selection voltage, and a non-designated selection voltage. The present disclosure reduces the number of transistors and saves layout areas when the programming or reading operation is performed.

20 Claims, 3 Drawing Sheets

(58) Field of Classification Search
    USPC .......................................................... 365/96
    See application file for complete search history.

(56) References Cited

U.S. PATENT DOCUMENTS

2010/0238733 A1* 9/2010 Fukuda ............... G11C 11/5621
                                                      365/185.17
2019/0392911 A1   12/2019 Jo

* cited by examiner

VOLTAGE CONTROL METHOD AND VOLTAGE CONTROL CIRCUIT FOR ANTI-FUSE MEMORY ARRAY

TECHNICAL FIELD

The present disclosure relates to the field of memories, and in particular, to a voltage control method and a voltage control circuit for an anti-fuse memory array.

BACKGROUND

An anti-fuse one-time-programmable (OTP) memory has been widely used in many fields, such as Key storage, Radio Frequency Identification (RFID), aerospace and the like, due to its stability, reliability, anti-interference and excellent radiation resistance. Programming or reading is a key step in writing or reading data from an anti-fuse circuit. The core of a programming circuit design is to control a programming voltage. More specifically, when a data storage unit needs to be programmed, a programming high voltage VCH will be input to the data storage unit, and when the data storage unit needs not to be programmed, the programming high voltage VCH will be not input to the data storage unit. When the data need to be read from the data storage unit, a reading voltage VCR less than the programming high voltage VCH will be input to the data storage unit. Therefore, a voltage VWP connected to a capacitor includes at least two different voltages, for example, the programming high voltage VCH and the reading voltage VCR. How to control the voltage VWP is the key to programming and reading the anti-fuse circuit.

SUMMARY

The present disclosure provides a voltage control method for an anti-fuse memory array.

The voltage control method for the anti-fuse memory array includes:

obtaining a storage data address, dividing the storage data address into a plurality of subdata addresses, decoding each subdata address to obtain a corresponding group of decoder output signals, and converting the corresponding group of decoder output signals into a group of control signals by a corresponding group of high voltage converters, connecting multiple groups of data selectors in series, connecting each group of control signals to one group of the multiple groups of data selectors, inputting at least two selection voltages to the multiple groups of data selectors, selecting one or more of the two selection voltages to output to an anti-fuse unit under the control of a control signal corresponding to the anti-fuse unit; and programming or reading an anti-fuse unit corresponding to the storage data address; the selection voltages input to multiple groups of data selectors include at least one of a programming selection voltage, a reading selection voltage, and a non-designated selection voltage.

In an embodiment, values of the selection voltages are not zero.

In an embodiment, each group of data selectors has at least two input ends, and each of the at least two input ends receives one of the selection voltages, and when a programming operation is performed, the selection voltages input to the at least two input ends of each group of data selectors include at least:

the programming selection voltage, and the non-designated selection voltage; or the programming selection voltage, and the reading selection voltage;

when a reading operation is performed, the selection voltages input to the at least two input ends of each group of data selectors include at least:

the reading selection voltage, and the non-designated selection voltage; or the reading selection voltage, and the reading selection voltage.

In an embodiment, the programming selection voltage or the reading selection voltage is output to the anti-fuse unit corresponding to the storage data address; the non-designated selection voltage or the reading selection voltage is output to non-designated anti-fuse units.

In an embodiment, each subdata address is decoded by one of a plurality of word line decoders.

In an embodiment, each group of high voltage converters generates a group of control signals based on the programming selection voltage or the reading selection voltage.

In an embodiment, when a programming operation is performed, if a datum "1" needs to be stored in an anti-fuse unit corresponding to the storage data address, the programming selection voltage is selected from the two selection voltages to input to the anti-fuse unit corresponding to the storage data address and a selection transistor of the anti-fuse unit corresponding to the storage data address is turned on, so that the datum "1" is stored in the anti-fuse unit corresponding to the storage data address; the non-designated selection voltage less than the programming selection voltage is selected from the two selection voltages to input to other anti-fuse units which do not correspond to the storage data address and selection transistors of the other anti-fuse units are turned off, so that a datum "0" is stored in the other anti-fuse units; when a reading operation is performed, if a datum "1" needs to be read out from the anti-fuse unit corresponding to the storage data address, the reading selection voltage is selected from the two selection voltages to input to the anti-fuse unit corresponding to the storage data address and the selection transistor of the anti-fuse unit corresponding to the storage data address is turned on, so that the datum "1" is read out from the anti-fuse unit corresponding to the storage data address; the non-designated selection voltage is selected from the two selection voltages to input to other anti-fuse units which do not correspond to the storage data address and selection transistors of the other anti-fuse units are turned off, so that the data cannot be read out from the other anti-fuse units. In an embodiment, if a x-th subdata address includes Nx bits of storage data, a x-th group of high voltage converters corresponding to the x-th subdata address includes $2^{Nx}$ high voltage converters and outputs $2^{Nx}$ control signals to a x-th group of data selectors; wherein x and Nx are positive integers.

In an embodiment, when x≥2, the x-th group of data selectors includes $2^{N1+N2+\cdots+Nx}$ data selectors.

In an embodiment, the multiple groups of data selectors include a first group of data selectors, and a last group of data selectors, which are connected in series. In an embodiment, one or more other groups of data selectors are connected in series with the first group of data selectors, and the last group of data selectors; when a programming operation is performed, input signals of the first group of data selectors include: a corresponding group of control signals, the programming selection voltage, and the non-designated selection voltage; or, a corresponding group of control signals, the programming selection voltage, and the reading selection voltage;

when a reading operation is performed, the input signals of the first group of data selectors include: a corresponding group of control signals, the reading selection voltage, and the non-designated selection voltage; or, a corresponding group of control signals, the reading selection voltage as received by a first input end of the first group of data selectors, and the reading the selection voltage as received by a second input end of the first group of data selectors;

when the programming or reading operation is performed, input signals of the last group of data selectors, or one group of the other groups of data selectors include: output signals of a previous group of data selectors, a corresponding group of control signals, and the non-designated selection voltage; or, output signals of the previous group of data selectors, the corresponding group of control signals, and the reading selection voltage;

output signals of the last group of data selectors are output to the anti-fuse unit corresponding to the storage data address to control the execution of programming or reading operations.

In an embodiment, a process that each group of control signals controls a corresponding group of data selectors is: when a control signal is a low level, a data selector corresponding to the control signal outputs one output signal of one data selector in the previous group of data selectors, the programming selection voltage, or the reading selection voltage; when the control signal is the programming selection voltage or the reading selection voltage, the data selector corresponding to the control signal outputs the non-designated selection voltage, or the reading selection voltage.

In an embodiment, each data selector includes a first PMOS transistor and a second PMOS transistor, wherein a gate of the first PMOS transistor is connected to a corresponding control signal, and a source of the first PMOS transistor is connected to one of the output signals of a previous group of data selectors, the programming selection voltage, or the reading selection voltage;

a gate of the second PMOS transistor is connected to an inverse signal of the control signal connected to the gate of the first PMOS transistor, and a source of the second PMOS transistor is connected to the non-designated selection voltage or the reading selection voltage;

a drain of the first PMOS transistor and a drain of the second PMOS transistor are connected to each other to act as an output end of the data selector.

The present disclosure also provides a voltage control circuit for an anti-fuse memory array, including:

a control signal generation module, used to obtain a storage data address, divide the storage data address into a plurality of subdata addresses, decode each subdata address to obtain a corresponding group of decoder output signals, and convert the corresponding group of decoder output signals into a group of control signals by a corresponding group of high voltage converters;

a control voltage output module, used to connect multiple groups of data selectors in series, connect each group of control signals to one group of the multiple groups of data selectors, output selection voltages input to each group of data selectors to an anti-fuse unit under the control of the corresponding group of control signals, and program or read an anti-fuse unit corresponding to the storage data address; wherein the selection voltages input to each group of data selectors include at least one of a programming selection voltage, a reading selection voltage, and a non-designated selection voltage.

In an embodiment, values of the selection voltages are not zero.

In an embodiment, each group of data selectors has at least two input ends, and each of the at least two input ends receives one of the selection voltages, and when a programming operation is performed, the selection voltages input to the at least two input ends of each group of data selectors includes at least:

the programming selection voltage, and the non-designated selection voltage; or the programming selection voltage, and the reading selection voltage;

when a reading operation is performed, the selection voltages input to the at least two input ends of each group of data selectors includes at least:

the reading selection voltage, and the non-designated selection voltage; or the reading selection voltage, and the reading selection voltage.

In an embodiment, the control voltage output module outputs the programming selection voltage or the reading selection voltage to the anti-fuse unit corresponding to the storage data address, and outputs the non-designated selection voltage or the reading selection voltage to non-designated anti-fuse units.

In an embodiment, the voltage control circuit includes a plurality of word line decoders, and each subdata address is decoded by one of the plurality of word line decoders.

In an embodiment, each high voltage converter includes a first input end, a second input end, and an output end, wherein the first input end receives a decoded storage data address, the second input end receives the programming selection voltage or the reading selection voltage, and each group of high voltage converters generates a group of control signals based on the programming selection voltage or the reading selection voltage.

In an embodiment, if a x-th subdata address includes Nx bits of storage data, a x-th group of high voltage converters corresponding to the x-th subdata address includes $2^{Nx}$ high voltage converters and outputs $2^{Nx}$ control signals to a x-th group of data selectors; wherein x and Nx are positive integers.

In an embodiment, when x>2, the x-th group of data selectors includes $2^{N1+N2+\cdots+Nx}$ data selectors, the $2^{N1+N2+\cdots+Nx}$ data selectors are connected to an output end of each high voltage converter in the x-th group of high voltage converters, and are used to receive control signals output from each high voltage converter.

In an embodiment, the voltage control circuit includes: a selection voltage control module, used to control multiple groups of the data selectors connected in series. The multiple groups of data selectors include a first group of data selectors, and a last group of data selectors, which are connected in series. In an embodiment, one or more other groups of data selectors are connected in series with the first group of data selectors, and the last group of data selectors. When a programming operation is performed, input signals of the first group of data selectors includes: a corresponding group of control signals, the programming selection voltage, and the non-designated anti-fuse unit selection voltage; or, a corresponding group of control signals, the programming selection voltage, the reading selection voltage;

when a reading operation is performed, the input signals of the first group of data selectors includes: a corresponding group of control signals, the reading selection voltage, and the non-designated selection voltage; or, a corresponding group of control signals, the reading selection voltage as received by a first input end of the first group of data selectors, and the reading the selection voltage as received by a second input end of the first group of data selectors;

when the programming or reading operation is performed, input signals of the last group of data selectors, or one group of the other groups of data selectors include: output signals of a previous group of data selectors, a corresponding group of control signals, and the non-designated selection voltage; or, output signals of the previous group of data selectors, the corresponding group of control signals, and the reading selection voltage;

output signals of the last group of data selectors are output to the anti-fuse unit corresponding to the storage data address to control the execution of programming or reading operations.

In an embodiment, a process that each group of control signals controls a corresponding group of data selectors is:

when a control signal is a low level, a data selector corresponding to the control signal outputs one output signal of one data selector in the previous group of data selectors, the programming selection voltage, or the reading selection voltage; when the control signal is the programming selection voltage or the reading selection voltage, the data selector corresponding to the control signal outputs the non-designated selection voltage or the reading selection voltage.

In an embodiment, each data selector includes a first PMOS transistor and a second PMOS transistor, wherein a gate of the first PMOS transistor is connected to a corresponding control signal, and a source of the first PMOS transistor is connected to one of the output signals of a previous group of data selectors, the programming selection voltage, or the reading selection voltage;

a gate of the second PMOS transistor is connected to an inverse signal of the control signal connected to the gate of the first PMOS transistor, and a source of the second PMOS transistor is connected to the non-designated selection voltage or the reading selection voltage;

a drain of the first PMOS transistor and a drain of the second PMOS transistor are connected to each other to act as an output end of the data selector.

As described above, the voltage control method and the voltage control circuit for the anti-fuse memory array provided by the present disclosure have the following beneficial effects:

The data storage address is divided into multiple subdata addresses to control multiple groups of data selectors corresponding to the multiple subdata addresses to output selection voltages. The above method avoids the exponential growth of the number of required high-voltage converters with the number of bits of the data storage address.

DETAILED DESCRIPTION

Figure 1:
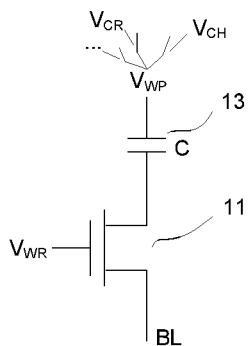
FIG. 1 is a schematic diagram of a traditional anti-fuse unit.

The embodiments of the present disclosure will be described below through specific examples. One skilled in the art can easily understand other advantages and effects of the present disclosure according to contents disclosed in the description. The present disclosure may also be implemented or applied through other different embodiments, and various modifications or changes may be made to all details in the description based on different points of view and applications without departing from the spirit of the present disclosure. It should be noted that the embodiments of the present disclosure and the features of the present disclosure can be combined with each other without conflict.

It should be noted that, the drawings provided in this embodiment only exemplify the basic idea of the present disclosure. Although only the components related to the present disclosure are shown in the drawings, they are not necessarily drawn according to the quantities, shapes, and sizes of the components during actual implementation. During actual implementation, the patterns, quantities, and proportions of the components may be changed as needed, and the layout of the components may be more complicated.

Referring to FIG. 1, a traditional anti-fuse unit includes a selection transistor 11 and a capacitor 13. The capacitor 13 is a MOS capacitor including an ion injection region, a gate oxide layer, and a polysilicon layer, and is used to store data. One end of the capacitor 13 is connected to a control voltage $V_{WP}$, the other end of the capacitor 13 is connected to a drain of the selection transistor 11, a gate of the selection transistor 11 is connected to a voltage $V_{WR}$, and a source of the selection transistor 11 is connected to a bit line BL.

Table 1 shows values of the control voltage $V_{WP}$ in different states. In a programming state, when the anti-fuse unit is selected for programming, the control voltage $V_{WP}$ is a high voltage $V_{CH}$, the selection transistor 11 is turned on (because the voltage $V_{WR}$ is a high level), and the bit line BL is connected to ground. At this time, a voltage difference across the capacitor 13 is close to the high voltage $V_{CH}$, and a dielectric layer of the capacitor 13 breaks down, so that the capacitor 13 is equivalent to a resistor (e.g., a resistance value of the resistor is close to 10 KΩ) and a datum "1" is stored. When the anti-fuse unit is not selected for programming, the control voltage $V_{WP}$ is zero, the selection transistor 11 is turned off. At this time, impedance of the capacitor 13 is very high (greater than 1 MΩ) and a datum "0" is stored. In a reading state, when the anti-fuse unit is selected for reading, the control voltage $V_{WP}$ is a voltage $V_{CR}$ (the voltage $V_{CR}$ is less than the high voltage $V_{CH}$), the selection transistor 11 is turned on (because the voltage $V_{WR}$ is a high level), and the BL is connected to ground. When the anti-fuse unit is not selected for reading, the selection transistor 11 is turned off (because the voltage $V_{WR}$ is zero), so that the data are not being read out.

TABLE 1

| values of the control voltage $V_{WP}$ in different states | | | | |
|---|---|---|---|---|
| | Programming | | Reading | |
| | selected | unselected | selected | unselected |
| $V_{WP}$ | $V_{CH}$ | 0 | $V_{CR}$ | 0 |

Figure 2:
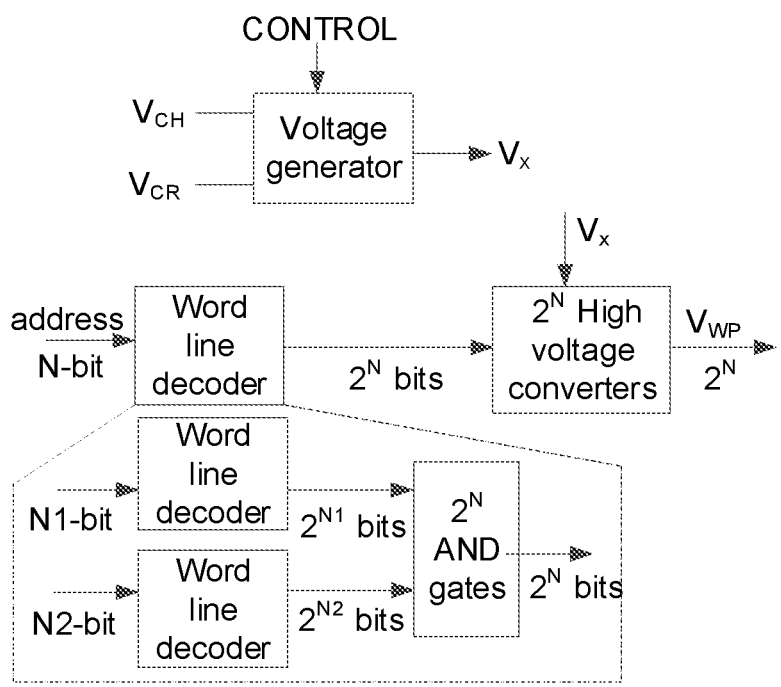
FIG. 2 is a structural diagram of a traditional control circuit generating a control voltage $V_{WP}$.

Referring to FIG. 2, a traditional control circuit generating the control voltage $V_{WP}$ includes a voltage generator, a word line decoder, and $2^N$ high voltage converters. When programming or reading, the voltage generator outputs the programming selection voltage $V_{CH}$ or the reading selection voltage $V_{CR}$ respectively. The word line decoder converts an address with N bits into $2^N$ signals, and then the $2^N$ high voltage converters convert the $2^N$ signals into $2^N$ control voltages $V_{WP}$ to input to the anti-fuse unit. If an anti-fuse unit is designated an address, the control voltage $V_{WP}$ corresponding to the anti-fuse unit is the programming selection voltage $V_{CH}$ or the reading selection voltage $V_{CR}$. If an anti-fuse unit is not designated an address, the corresponding control voltage $V_{WP}$ is zero. Therefore, the control circuit in FIG. 2 can realize the control voltages $V_{WP}$ in Table 1. However, the above solution has the following shortcomings: 1), the number of the high voltage converters is exponentially related to the number of bits N of the address. When a storage space of a memory is large, the increase in the number of bits N of the address leads to a dramatic increase in the number of high voltage converters required, which will take up a lot of layout areas; 2), the increase in the number of the high voltage converters will increase the load on the voltage generator; 3), the voltage connected to an anti-fuse unit can only be zero when the anti-fuse unit is not selected.

In order to solve the above problems, the present disclosure provides a voltage control method for an anti-fuse memory array.

In an embodiment, we assume that the number of bits for a storage data address is N. The N bits of the storage data address is used to designate an address for a selected anti-fuse unit; that is, the storage data address is the address of the selected anti-fuse unit. The anti-fuse unit is controlled to be programmed or read by means of selection voltages. Potential selection voltages include at least a programming selection voltage $V_{CH}$, a reading selection voltage $V_{CR}$, and a non-designated selection voltage $V_{CL}$, where values of the selection voltages $V_{CH}$, $V_{CR}$ and $V_{CL}$ are not zero. In the present disclosure, an anti-fuse unit corresponding to the storage data address is called the selected anti-fuse unit, and the anti-fuse unit which do not correspond to the storage data address is called the unselected anti-fuse unit. In a programming stage, if a datum "1" needs to be stored in the selected anti-fuse unit, the control voltage $V_{WP}$ of the selected anti-fuse unit is connected to the programming selection voltage $V_{CH}$, the selection transistor 11 of the selected anti-fuse unit is turned on, and the bit line BL of the selected anti-fuse unit is connected to ground, at which time, the voltage difference across the capacitor 13 of the selected anti-fuse unit is close to the programming selection voltage $V_{CH}$, and the dielectric layer of the capacitor 13 breaks down, so that the datum "1" is stored in the selected anti-fuse unit; meanwhile, the control voltage $V_{WP}$ of the unselected anti-fuse units is connected to the non-designated selection voltage $V_{CL}$, and the selection transistors 11 of the unselected anti-fuse units are turned off. Because the non-designated selection voltage $V_{CL}$ is less than the programming selection voltage $V_{CH}$, the dielectric layer does not break down, so that the datum "0" is stored in the unselected anti-fuse units. In the reading stage, if a datum "1" needs to be read out from the selected anti-fuse unit, the control voltage $V_{WP}$ of the selected anti-fuse unit is connected to the reading selection voltage $V_{CR}$, the selection transistor 11 of the selected anti-fuse unit is turned on, and the bit line BL of the selected anti-fuse unit is connected to ground, so that the datum "1" is read out from the selected anti-fuse unit. For any unselected anti-fuse unit (i.e., the storage data address is not designated to this anti-fuse unit), its control voltage $V_{WP}$ is connected to the non-designated selection voltage $V_{CL}$, its selection transistor 11 is turned off, and therefore the data cannot be read out from any unselected anti-fuse unit. Please refer to Table 2 for the control voltage $V_{WP}$.

TABLE 2

Example 1 of the control voltage $V_{WP}$

| | Programming | | Reading | |
|---|---|---|---|---|
| | selected | unselected | selected | unselected |
| $V_{WP}$ | $V_{CH}$ | $V_{CL}$ | $V_{CR}$ | $V_{CL}$ |

In an embodiment, the N bits of the storage data address is divided into a plurality of subdata addresses, and each subdata address is decoded respectively. There are M word line decoders (M≥2), M groups of high voltage converters, and M groups of data selectors (i.e., MUX selectors). The N bits of the storage data address is divided into M subdata addresses and each of the M subdata addresses are input to a corresponding one of the M word line decoders respectively. The M subdata addresses include $N_1, N_2, \ldots, N_M$ bits respectively. The x-th (X=1, 2, . . . , M) word line decoder receives the $N_x$ bits of the x-th subdata address, generates $2^{Nx}$ output signals, and outputs the $2^{Nx}$ output signals to the x-th group of high voltage converters. The x-th group of high voltage converters includes $2^{Nx}$ high voltage converters, and generates $2^{Nx}$ control signals $V_{ctrlx}$ based on a signal $V_x$ and $2^{Nx}$ output signals of the x-th (X=1, 2, . . . , M) word line decoder. The $2^{Nx}$ control signals $V_{ctrlx}$ are input to the x-th group of MUX selectors, where $V_x$ is the programming selection voltage $V_{CH}$ when in the programming stage, and is the reading selection voltage $V_{CR}$ when in the reading stage. The x-th group of MUX selectors includes $2^{N1+N2+\cdots+Nx}$ MUX selectors.

Figure 3:
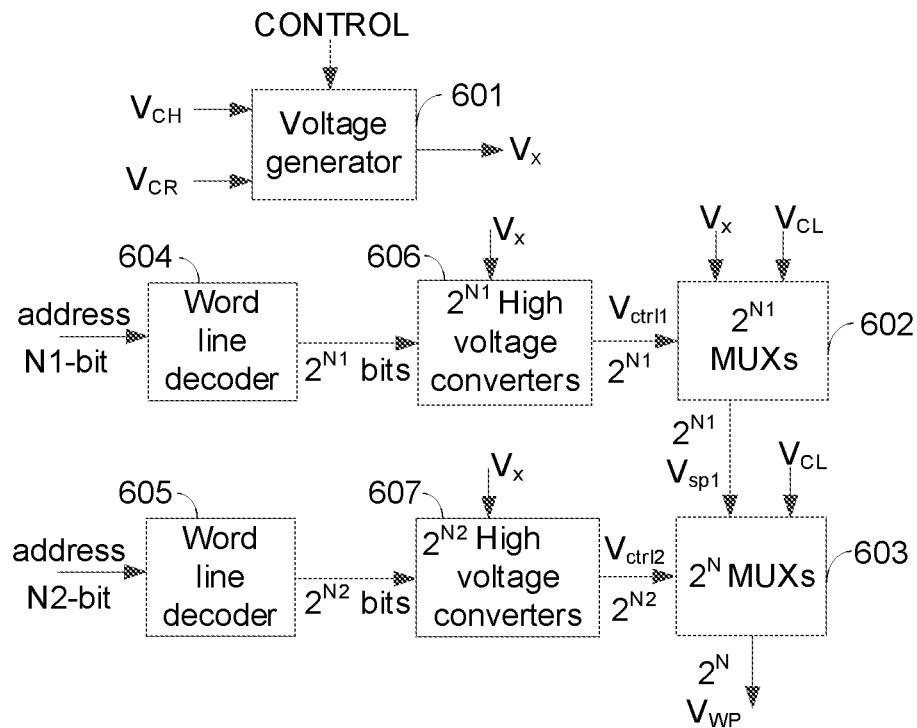
FIG. 3 is a structural diagram of a control circuit generating a control voltage $V_{WP}$ according to an embodiment of the present disclosure.

In an embodiment, referring to FIG. 3, the N bits of the storage data address are divided into two subdata addresses. The numbers of bits of the two subdata addresses are N1 and N2 respectively, and N1+N2=N. The word line decoder 604 converts the $N_1$ bits of the subdata address into $2^{N1}$ signals, where only one of the $2^{N1}$ signals is at a low level, and the others are at a high level. The $2^{N1}$ signals are input to the first group of high voltage converters 606. The first group of high voltage converters 606 includes $2^{N1}$ high voltage converters, receives the output signal $V_x$ from the voltage generator 601, converts the $2^{N1}$ signals from the word line decoder 604 into $2^{N1}$ control signals $V_{ctrl1}$ for the first group of MUX selectors 602. Only one of the $2^{N1}$ control signals $V_{ctrl1}$ is "0", the others are the voltage $V_x$. The voltage $V_x$ is the programming selection voltage $V_{CH}$ in the programming stage and is the reading selection voltage $V_{CR}$ in the reading stage.

The first group of MUX selectors 602 includes $2^{N1}$ MUX selectors. $V_x$ and $V_{CL}$ are used as input signals of the first group of MUX selectors 602, and are applied to each of the $2^{N1}$ MUX selectors. When one of the $2^{N1}$ control signal is a low level, a corresponding MUX selector outputs the voltage $V_x$; when one of the $2^{N1}$ control signal is a high level, a corresponding MUX selector outputs the non-designated selection voltage $V_{CL}$. In an embodiment, $2^{N1}$ control signals $V_{ctrl1}$ are input to the first group of MUX selectors 602. As mentioned above, only one of the $2^{N1}$ control signals $V_{ctrl1}$ is "0", therefore, only one of the output signals $V_{sp1}$ output from the first group of MUX selectors 602 is the voltage $V_x$, and the others ($2^{N1}-1$) are the non-designated selection voltage $V_{CL}$.

Similarly, the word line decoder 605 converts the N2 bits of the subdata address into $2^{N2}$ output signals, where only one of the $2^{N2}$ output signals is at a low level, and the others are at a high level. The second group of high voltage converters 607 includes $2^{N2}$ high voltage converters, which convert the $2^{N2}$ output signal from the word line decoder 605 into $2^{N2}$ control signals $V_{ctrl2}$. Only one of the $2^{N2}$ control signals $V_{ctrl2}$ is "0", the others are the voltage $V_x$. The $2^{N2}$ control signals $V_{ctrl2}$ are used as the control signals of the second group of MUX selector 603.

The first group of MUX selectors 602 and the second group of MUX selectors 603 are connected in series, so that the output signals of the first group of MUX selectors 602 are used as the input signals of the second group of MUX selectors 603. Meanwhile, the voltage generator 601 transmits the non-designated selection voltage to each group of MUX selectors.

The second group of MUX selectors 603 includes $2^N$ MUX selectors, and each MUX selector includes two selection voltage input ends, a control voltage input end, and an output end. One of the two selection voltage input ends is connected to the non-designated selection voltage $V_{CL}$, and the other of the two selection voltage input ends is connected to the $2^{N1}$ output signals $V_{sp1}$ of the first group of MUX selectors 602. Each of the $2^{N1}$ output signals $V_{sp1}$ is simultaneously applied to the $2^{N2}$ MUX selectors in the second group of MUX selectors 603. Each of the $2^{N2}$ control signals $V_{ctrl2}$ is simultaneously applied to $2^{N1}$ MUX selectors in the second group of MUX selectors 603. Since only one of the control signals $V_{ctrl2}$ is "0", $2^{N1}$ MUX selectors in the second group of MUX selectors 603 output the $2^{N1}$ output signals $V_{sp1}$. Since only one of the $2^{N1}$ output signals $V_{sp1}$ output from the first group of MUX selectors 602 is the voltage $V_x$, and the others are the non-designated selection voltage $V_{CL}$. Therefore, only one of the $2^N$ output signals $V_{WP}$ output from the second group of MUX selectors 603 is the voltage $V_x$, and the others are the non-designated selection voltage $V_{CL}$.

Figure 4:
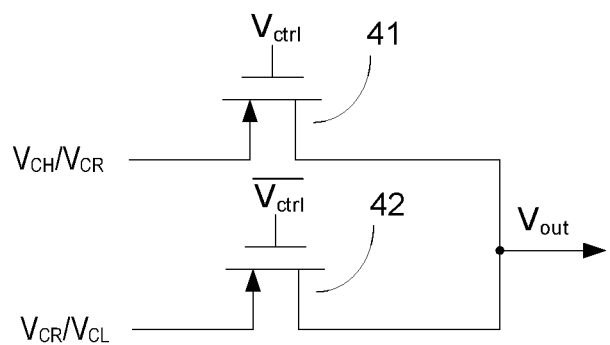
FIG. 4 is a structural diagram of a MUX selector according to an embodiment of the present disclosure.

Referring to FIG. 4, each MUX selector includes a transistor 41 and a transistor 42, and the transistor 41 and the transistor 42 are PMOS transistors. A gate of the transistor 41 is connected to the control signal $V_{ctrl}$, a source of the transistor 41 is connected to the voltage $V_x$ or output signals $V_{sp1}$, a gate of the transistor 42 is connected to a reverse signal $\overline{V}_{ctrl}$ of the control signal $V_{ctrl}$, a source of the transistor 42 is connected to the programming selection voltage $V_{CL}$, and a drain of the transistor 41 and a drain of the transistor 42 are connected to act as an output end $V_{out}$ of the MUX selector.

Compared with the traditional control circuit generating the control voltage $V_{WP}$, the present disclosure can effectively reduce the number of high voltage converters and save the layout areas. The differences between the embodiment shown in FIG. 3 and the traditional control circuit in FIG. 2 are as follows: the present disclosure requires $2^{N1}+2^{N2}$ high voltage converters and $2^N+2^{N1}$ MUX selectors; while the traditional control circuit requires $2^N$ high voltage converters and $2^N$ AND gates. Normally, each high voltage converters includes at least 6 transistors, each MUX selector includes 2 transistors, each AND gate includes 6 transistors. Therefore, the number of transistors required by the present disclosure is $6(2^{N1}+2^{N2})+2(2^N+2^{N1})=_8\times2^{N1}+6\times2^{N2}+2\times2^N$, while the number of transistors required by the traditional control circuit is $12\times2^N$.

Compared with the number of transistors required by the traditional control circuit, the number of transistors required by the present disclosure is reduced by 62.5% when the number of bits of the storage data address is 5 (that is, N=5), by 76% when the number of bits of the storage data address is 8 (that is, N=8), and by 81.5% when the number of bits of the storage data address is 12 (that is, N=12). As the number of bits of the storage data address increases, the above percentages indicating that the number of transistors decreases increase rapidly. Therefore, the technology for the large-capacity anti-fuse OTP memory can effectively reduce the layout areas and save the cost.

In another embodiment, referring to Table 3, the reading selection voltage can be used as the non-designated selection voltage in the programming stage. In the reading stage, all anti-fuse units are always connected to the reading selection voltage, the anti-fuse units are controlled to be read by controlling the selection transistors of the anti-fuse units to be turned on or turned off. Specifically, in the programming stage, if a datum "1" needs to be stored in the selected anti-fuse unit, the control voltage $V_{WP}$ of the selected anti-fuse unit is connected to the programming selection voltage $V_{CH}$, the selection transistor 11 of the selected anti-fuse unit is turned on, and the bit line BL of the selected anti-fuse unit is connected to ground. At this time, the voltage difference across the capacitor 13 of the selected anti-fuse unit is close to the programming selection voltage $V_{CH}$, and the dielectric layer breaks down, so that the datum "1" is stored in the selected anti-fuse unit; meanwhile, the control voltage $V_{WP}$ of the unselected anti-fuse units is connected to the reading selection voltage $V_{CR}$, and the selection transistors 11 of the unselected anti-fuse units are turned off. Because the reading selection voltage $V_{CR}$ is less than the programming selection voltage $V_{CH}$, the dielectric layer does not break down, so that the datum "0" is stored in the unselected anti-fuse units. In the reading stage, if a datum "1" needs to be read out from the selected anti-fuse unit, the control voltage $V_{WP}$ of the selected anti-fuse unit is always connected to the reading selection voltage $V_{CR}$, and the data in the anti-fuse unit are controlled to be read by turning on or turning off the selection transistor 11 of the selected anti-fuse unit. That is, the selection transistor 11 of the selected anti-fuse unit is turned on when the selected anti-fuse unit needs to be read, meanwhile the selection transistors 11 of the unselected anti-fuse units are turned off and then the data are not read out from the unselected anti-fuse units.

TABLE 3

Example 2 of the control voltage $V_{WP}$

|  | Programming | | Reading | |
| --- | --- | --- | --- | --- |
|  | selected | unselected | selected | unselected |
| $V_{WP}$ | $V_{CH}$ | $V_{CR}$ | $V_{CR}$ | $V_{CR}$ |

Figure 5:
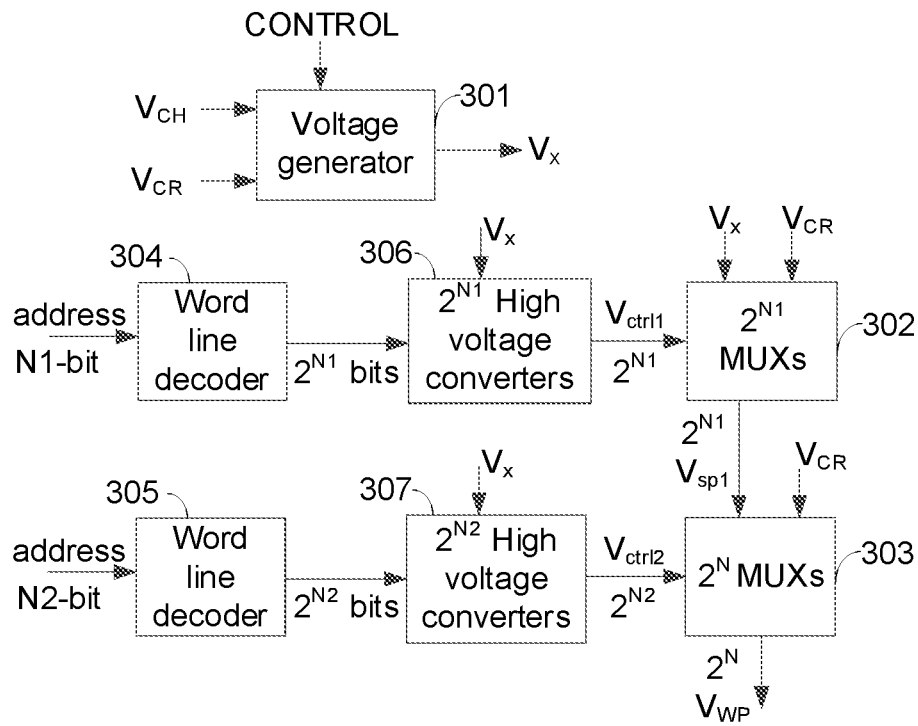
FIG. 5 is a structural diagram of a control circuit generating a control voltage $V_{WP}$ according to an embodiment of the present disclosure.

Referring to FIG. 5, compared with the embodiment of FIG. 3, the non-designated selection voltage $V_{CL}$ can be replaced with the reading selection voltage $V_{CR}$. In the programming state, the programming selection voltage $V_{CH}$ is applied to the anti-fuse unit with the designated address, and the reading selection voltage $V_{CR}$ is applied to the anti-fuse unit with the non-designated address. In the reading stage, the reading selection voltage $V_{CR}$ is connected to anti-fuse units with all addresses. The working principle will not be repeated herein.

TABLE 4

Example 3 of the control voltage $V_{WP}$

|  | Programming | | Reading | |
| --- | --- | --- | --- | --- |
|  | selected | unselected | selected | unselected |
| $V_{WP}$ | $V_{CH}$ | $V_{CR}$ | $V_{CR}$ | $V_{CL}$ |

Referring to Table 4. In the programming stage, if a datum "1" needs to be stored in the selected anti-fuse unit, the control voltage $V_{WP}$ of the selected anti-fuse unit is connected to the programming selection voltage $V_{CH}$, the selection transistor 11 of the selected anti-fuse unit is turned on, and the bit line BL of the selected anti-fuse unit is connected to ground. At this time, the voltage difference across the capacitor 13 of the selected anti-fuse unit is close to the programming selection voltage $V_{CH}$, and the dielectric layer breaks down, so that the datum "1" is stored in the selected anti-fuse unit. Meanwhile, the control voltage $V_{WP}$ of the unselected anti-fuse units is connected to the reading selection voltage $V_{CR}$, and the selection transistor 11 of the unselected anti-fuse units is turned off. Because the reading selection voltage $V_{CR}$ is less than the programming selection voltage $V_{CH}$, the dielectric layer does not break down, so that the datum "0" is stored in the unselected anti-fuse units. In the reading stage, if a datum needs to be read out from the selected anti-fuse unit, the control voltage $V_{WP}$ of the selected anti-fuse unit is connected to the reading selection voltage $V_{CR}$, the selection transistor 11 of the selected anti-fuse unit is turned on, and the bit line BL of the selected anti-fuse unit is connected to ground. For any unselected anti-fuse unit (i.e., the storage data address is not designated to anti-fuse units), its control voltage $V_{WP}$ is connected to the non-designated selection voltage $V_{CL}$ and its selection transistor 11 is turned off, therefore the data cannot be read out from any unselected anti-fuse unit.

Figure 6:
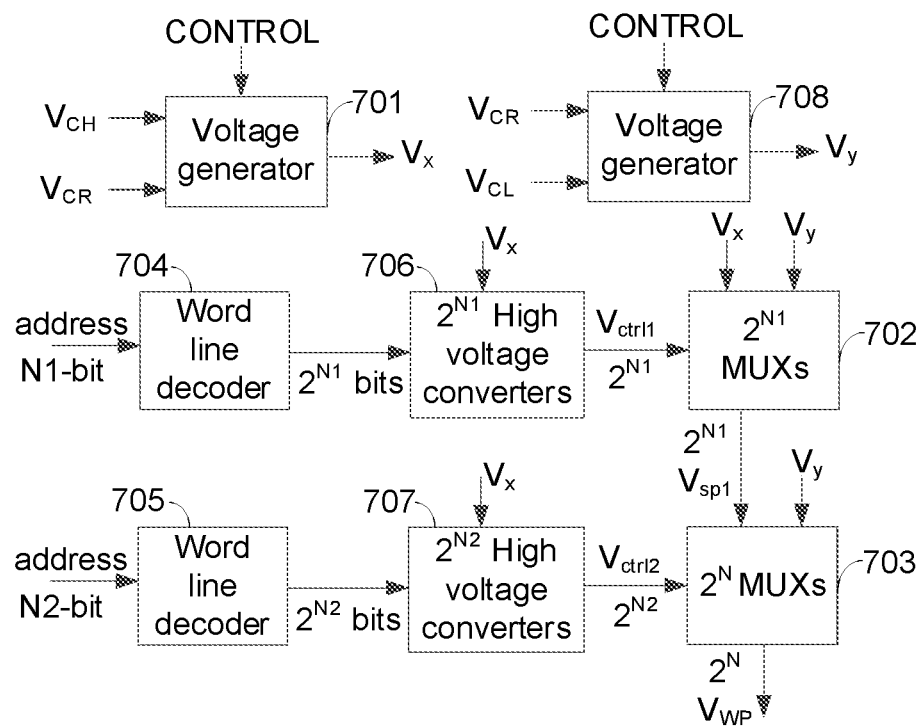
FIG. 6 is a structural diagram of a control circuit generating a control voltage $V_{WP}$ according to an embodiment of the present disclosure.

Please refer to FIG. 6, two voltage generators can be set according to the control voltage $V_{WP}$ in Table 4. One of the two voltage generators is used to generate the programming selection voltage $V_{CH}$ and the reading selection voltage $V_{CR}$, and the other of the two voltage generators is used to generate the reading selection voltage $V_{CR}$ and the non-designated selection voltage $V_{CL}$. The programming stage and the reading stage of the anti-fuse unit are handled by two voltage generators respectively. In an embodiment, a voltage generator 708 is added, and the input voltage $V_x$ of the MUX selectors in the group of MUX selectors 702 is from the output signals of the voltage generator 701 and the input voltage $V_y$ of the MUX selectors in the group of MUX selectors 702 is from the output signals of the voltage generator 708 in the reading stage. Similarly, the output signals of the second group of MUX selectors 703 are $2^N$, where only one of the $2^N$ output signals is $V_x$, and the others are $V_y$. The output signal $V_x$ from the voltage generator 701 is the programming selection voltage $V_{CH}$ in the programming stage, and is the reading selection voltage $V_{CR}$ in the reading stage. The output signals $V_y$ from the voltage generator 708 is the reading selection voltage $V_{CR}$ in the programming stage, and is the non-designated selection voltage $V_{CL}$ in the reading stage. In the programming state, the programming selection voltage $V_{CH}$ is input to the anti-fuse unit with the designated address, the reading selection voltage $V_{CR}$ is input to the anti-fuse unit with the non-designated address. In the reading stage, the reading selection voltage $V_{CR}$ is input to the anti-fuse unit with the designated address, the non-designated selection voltage $V_{CL}$ is input to the anti-fuse unit with the non-designated address.

In an embodiment, the present disclosure provides a voltage control circuit for the anti-fuse memory array. The voltage control circuit includes a control signal generation module, and a control voltage output module.

The control signal generation module is used to obtain a storage data address, divide the storage data address into a plurality of subdata addresses, decode each subdata address to obtain a corresponding group of decoder output signals, and convert the corresponding group of decoder output signals into a group of control signals by a corresponding group of high voltage converters.

The control voltage output module is used to connect multiple groups of data selectors in series, connect each group of control signals to one group of the multiple groups of data selectors, inputting at least two selection voltages to the multiple groups of data selectors, selecting one or more of the two selection voltages to output to an anti-fuse unit under the control of a control signal corresponding to the anti-fuse unit, and program or read an anti-fuse unit corresponding to the storage data address. The selection voltages input to multiple groups of data selectors include at least one of a programming selection voltage, a reading selection voltage, and a non-designated selection voltage.

In an embodiment, the voltage control circuit further includes one or more voltage generators. The one or more voltage generators are used to generate selection voltages, and values of the selection voltages are not zero.

In an embodiment, each group of data selectors has at least two input ends, and each of the at least two input ends receives one of the selection voltages, and when a programming operation is performed, the selection voltages input to the at least two input ends of each group of data selectors includes at least:

the programming selection voltage, and the non-designated selection voltage; or the programming selection voltage, and the reading selection voltage;

when a reading operation is performed, the selection voltages input to the at least two input ends of each group of data selectors include at least:

the reading selection voltage, and the non-designated selection voltage; or the reading selection voltage, and the reading selection voltage.

In an embodiment, the control voltage output module outputs the programming selection voltage or the reading selection voltage to the anti-fuse unit corresponding to the storage data address, and outputs the non-designated selection voltage or the reading selection voltage to non-designated anti-fuse units.

In an embodiment, the voltage control circuit includes a plurality of word line decoders, each subdata address is decoded by one of the plurality of word line decoders.

In an embodiment, each high voltage converter includes a first input end, a second input end, and an output end, wherein the first input end receives a decoded storage data address, the second input end receives the programming selection voltage or the reading selection voltage, and each group of high voltage converters generates a group of control signals based on the programming selection voltage or the reading selection voltage.

In an embodiment, if a x-th subdata address includes Nx bits of storage data, a x-th group of high voltage converters corresponding to the x-th subdata address includes $2^{Nx}$ high voltage converters and outputs $2^{Nx}$ control signals to a x-th group of data selectors; wherein x and Nx are positive integers.

In an embodiment, when x>2, the x-th group of data selectors includes $2^{N1+N2+\cdots+Nx}$ data selectors, the $2^{N1+N2+\cdots+Nx}$ data selectors are connected to an output end of each high voltage converter in the x-th group of high voltage converters, and are used to receive control signals output from each high voltage converter.

In an embodiment, the voltage control circuit includes: a selection voltage control module, used to control multiple groups of the data selectors connected in series, the multiple groups of data selectors include a first group of data selectors, and a last group of data selectors, which are connected in series, one or more other groups of data selectors are connected in series with the first group of data selectors, and the last group of data selectors, when a programming operation is performed, input signals of the first group of data selectors includes: a corresponding group of control signals, the programming selection voltage, and the non-designated anti-fuse unit selection voltage; or, a corresponding group of control signals, the programming selection voltage, the reading selection voltage.

When a reading operation is performed, the input signals of the first group of data selectors includes: a corresponding group of control signals, the reading selection voltage, and the non-designated selection voltage; or, a corresponding group of control signals, the reading selection voltage as received by a first input end of the first group of data selectors, and the reading the selection voltage as received by a second input end of the first group of data selectors.

when the programming or reading operation is performed, input signals of the last group of data selectors, or one group of the other groups of data selectors includes: output signals of a previous group of data selectors, a corresponding group of control signals, and the non-designated selection voltage; or, output signals of the previous group of data selectors, the corresponding group of control signals, and the reading selection voltage.

output signals of the last group of data selectors are output to the anti-fuse unit corresponding to the storage data address to control the execution of programming or reading operations.

In an embodiment, a process that each group of control signals controls a corresponding group of data selectors is:

when a control signal is a low level, a data selector corresponding to the control signal outputs one output signal of one data selector in the previous group of data selectors, the programming selection voltage, or the reading selection voltage; when the control signal is the programming selection voltage or the reading selection voltage, the data selector corresponding to the control signal outputs the non-designated selection voltage or the reading selection voltage.

In an embodiment, each data selector includes a first PMOS transistor and a second PMOS transistor, a gate of the first PMOS transistor is connected to a corresponding control signal, and a source of the first PMOS transistor is connected to one of the output signals of a previous group of data selectors, the programming selection voltage, or the reading selection voltage.

a gate of the second PMOS transistor is connected to an inverse signal of the control signal connected to the gate of the first PMOS transistor, and a source of the second PMOS transistor is connected to the non-designated selection voltage or the reading selection voltage.

a drain of the first PMOS transistor and a drain of the second PMOS transistor are connected to each other to act as an output end of the data selector.

As described above, the present disclosure provides a voltage control method and a voltage control circuit for an anti-fuse memory array. The voltage control method and the voltage control circuit can greatly reduce the number of high-voltage converters, effectively reduce the load of the voltage generator and save the layout area, when the anti-fuse unit is programmed or read.

The foregoing embodiments only describe several implementations of the present disclosure, and their description is specific and detailed, but cannot therefore be understood as a limitation to the patent scope of the present disclosure. It should be noted that, a person of ordinary skill in the art may further make several variations and improvements without departing from the concept of the present disclosure, which shall fall within the protection scope of the present disclosure. Therefore, the protection scope of the present disclosure shall be subject to the appended claims.

What is claimed is:

1. A voltage control method for an anti-fuse memory array, comprising:

obtaining a storage data address, dividing the storage data address into a plurality of subdata addresses, decoding each subdata address to obtain a corresponding group of decoder output signals, and converting the corresponding group of decoder output signals into a group of control signals by a corresponding group of high voltage converters; and connecting multiple groups of data selectors in series, connecting each group of control signals to one group of the multiple groups of data selectors, inputting at least two selection voltages to the multiple groups of data selectors, selecting one or more of the two selection voltages to output to an anti-fuse unit under the control of a control signal corresponding to the anti-fuse unit; and programming or reading an anti-fuse unit corresponding to the storage data address; wherein the selection voltages input to multiple groups of data selectors comprise at least one of a programming selection voltage, a reading selection voltage, and a non-designated selection voltage.

2. The voltage control method for an anti-fuse memory array according to claim 1, wherein each group of data selectors has at least two input ends, and each of the at least two input ends receives one of the selection voltages, and when a programming operation is performed, the selection voltages input to the at least two input ends of each group of data selectors comprises at least:

the programming selection voltage, and the non-designated selection voltage; or the programming selection voltage, and the reading selection voltage;

when a reading operation is performed, the selection voltages input to the at least two input ends of each group of data selectors comprise at least:

the reading selection voltage, and the non-designated selection voltage; or the reading selection voltage, and the reading selection voltage.

3. The voltage control method for an anti-fuse memory array according to claim 1, wherein each group of high voltage converters generates a group of control signals based on the programming selection voltage or the reading selection voltage.

4. The voltage control method for an anti-fuse memory array according to claim 3, wherein when a programming operation is performed, if a datum "1" needs to be stored in an anti-fuse unit corresponding to the storage data address, the programming selection voltage is selected from the two selection voltages to input to the anti-fuse unit corresponding to the storage data address and a selection transistor of the anti-fuse unit corresponding to the storage data address is turned on, so that the datum "1" is stored in the anti-fuse unit corresponding to the storage data address; the non-designated selection voltage less than the programming selection voltage is selected to input to other anti-fuse units which do not correspond to the storage data address and selection transistors of the other anti-fuse units are turned off, so that a datum "0" is stored in the other anti-fuse units;

wherein when a reading operation is performed, if a datum "1" needs to be read out from the anti-fuse unit corresponding to the storage data address, the reading selection voltage is selected to input to the anti-fuse unit corresponding to the storage data address and a selection transistor of the anti-fuse unit corresponding to the storage data address is turned on, so that the datum "1" is read out from the anti-fuse unit corresponding to the storage data address; the non-designated selection voltage is selected to input to other anti-fuse units which do not correspond to the storage data address and selection transistors of the other anti-fuse units are turned off, so that the data cannot be read out from the other anti-fuse units.

5. The voltage control method for an anti-fuse memory array according to claim 1, wherein if a x-th subdata address comprises $N_x$ bits of storage data, a x-th group of high voltage converters corresponding to the x-th subdata address comprises $2^{N_x}$ high voltage converters and outputs $2^{N_x}$ control signals to a x-th group of data selectors; wherein x and $N_x$ are positive integers.

6. The voltage control method for an anti-fuse memory array according to claim 5, wherein when the x-th group of data selectors comprises $2^{N1+N2+\cdots+Nx}$ data selectors.

7. The voltage control method for an anti-fuse memory array according to claim 1, wherein the multiple groups of data selectors comprise a first group of data selectors, and a last group of data selectors, which are connected in series, one or more other groups of data selectors are connected in series with the first group of data selectors, and the last group of data selectors; when a programming operation is performed, input signals of the first group of data selectors comprise: a corresponding group of control signals, the programming selection voltage, and the non-designated selection voltage; or, a corresponding group of control signals, the programming selection voltage, and the reading selection voltage;

when a reading operation is performed, the input signals of the first group of data selectors comprise: a corresponding group of control signals, the reading selection voltage, and the non-designated selection voltage; or, a corresponding group of control signals, the reading selection voltage as received by a first input end of the first group of data selectors, and the reading the selection voltage as received by a second input end of the first group of data selectors;

when the programming or reading operation is performed, input signals of the last group of data selectors, or one group of the other groups of data selectors comprises: output signals of a previous group of data selectors, a corresponding group of control signals, and the non-designated selection voltage; or, output signals of the previous group of data selectors, the corresponding group of control signals, and the reading selection voltage;

output signals of the last group of data selectors are output to the anti-fuse unit corresponding to the storage data address to control the execution of programming or reading operations.

8. The voltage control method for an anti-fuse memory array according to claim 7, wherein a process that each group of control signals controls a corresponding group of data selectors is:

when a control signal is a low level, a data selector corresponding to the control signal outputs one output signal of one data selector in the previous group of data selectors, the programming selection voltage, or the reading selection voltage; when the control signal is the programming selection voltage or the reading selection voltage, the data selector corresponding to the control signal outputs the non-designated selection voltage, or the reading selection voltage.

9. The voltage control method for an anti-fuse memory array according to claim 7, wherein each data selector comprises a first PMOS transistor and a second PMOS transistor, wherein a gate of the first PMOS transistor is connected to a corresponding control signal, and a source of the first PMOS transistor is connected to one of the output signals of a previous group of data selectors, the programming selection voltage or the reading selection voltage;

a gate of the second PMOS transistor is connected to an inverse signal of the control signal connected to the gate of the first PMOS transistor, and a source of the second PMOS transistor is connected to the non-designated selection voltage or the reading selection voltage;

a drain of the first PMOS transistor and a drain of the second PMOS transistor are connected to each other to act as an output end of each data selector.

10. A voltage control circuit for an anti-fuse memory array, comprising:

a control signal generation module, used to obtain a storage data address, divide the storage data address into a plurality of subdata addresses, decode each subdata address to obtain a corresponding group of decoder output signals, and convert the corresponding group of decoder output signals into a group of control signals by a corresponding group of high voltage converters;

a control voltage output module, used to connect multiple groups of data selectors in series, connect each group of control signals to one group of the multiple groups of data selectors, inputting at least two selection voltages to the multiple groups of data selectors, selecting one or more of the two selection voltages to output to an anti-fuse unit under the control of a control signal corresponding to the anti-fuse unit; and program or read an anti-fuse unit corresponding to the storage data address; wherein the selection voltages input to multiple groups of data selectors comprise at least one of a programming selection voltage, a reading selection voltage, and a non-designated selection voltage.

11. The voltage control circuit for an anti-fuse memory array according to claim 10, wherein values of the selection voltages are not zero.

12. The voltage control circuit for an anti-fuse fused memory array according to claim 10, wherein each group of data selectors has at least two input ends, and each of the at least two input ends receives one of the selection voltages, and when a programming operation is performed, the selection voltages input to the at least two input ends of each group of data selectors comprises at least:

the programming selection voltage, and the non-designated selection voltage; or the programming selection voltage, and the reading selection voltage;

when a reading operation is performed, the selection voltages input to the at least two input ends of each group of data selectors comprises at least:

the reading selection voltage, and the non-designated selection voltage; or the reading selection voltage, and the reading selection voltage.

13. The voltage control circuit for an anti-fuse memory array according to claim 12, wherein the control voltage output module outputs the programming selection voltage or the reading selection voltage to the anti-fuse unit corresponding to the storage data address, and outputs the non-designated selection voltage or the reading selection voltage to non-designated anti-fuse units.

14. The voltage control circuit for an anti-fuse memory array according to claim 10, the voltage control circuit comprising: a plurality of word line decoders, each subdata address is decoded by one of the plurality of word line decoders.

15. The voltage control circuit for an anti-fuse memory array according to claim 10, wherein each high voltage converter comprises a first input end, a second input end, and an output end, wherein the first input end receives a decoded storage data address, the second input end receives the programming selection voltage or the reading selection voltage, and each group of high voltage converters generates a group of control signals based on the programming selection voltage or the reading selection voltage.

16. The voltage control circuit for an anti-fuse memory array according to claim 10, wherein if a x-th subdata address comprises $N_x$ bits of storage data, a x-th group of high voltage converters corresponding to the x-th subdata address comprises $2^{N_x}$ high voltage converters and outputs $2^{N_x}$ control signals to a x-th group of data selectors; wherein x and $N_x$ are positive integers.

17. The voltage control circuit for an anti-fuse memory array according to claim 15, wherein when x≥2, the x-th group of data selectors comprises $2^{N1+N2+\cdots+Nx}$ data selectors, the $2^{N1+N2+\cdots+Nx}$ data selectors are connected to an output end of each high voltage converter in the x-th group of high voltage converters, and are used to receive control signals output from each high voltage converter.

18. The voltage control circuit for an anti-fuse memory array according to claim 10, the voltage control circuit comprising: a selection voltage control module, used to control multiple groups of the data selectors connected in series, the multiple groups of data selectors comprise a first group of data selectors, and a last group of data selectors, which are connected in series, one or more other groups of data selectors are connected in series with the first group of data selectors, and the last group of data selectors, when a programming operation is performed, input signals of the first group of data selectors comprises: a corresponding group of control signals, the programming selection voltage, and the non-designated anti-fuse unit selection voltage; or, a corresponding group of control signals, the programming selection voltage, the reading selection voltage;

when a reading operation is performed, the input signals of the first group of data selectors comprises: a corresponding group of control signals, the reading selection voltage, and the non-designated selection voltage; or, a corresponding group of control signals, the reading selection voltage as received by a first input end of the first group of data selectors, and the reading the selection voltage as received by a second input end of the first group of data selectors;

when the programming or reading operation is performed, input signals of the last group of data selectors, or one group of the other groups of data selectors comprise: output signals of a previous group of data selectors, a corresponding group of control signals, and the non-designated selection voltage; or, output signals of the previous group of data selectors, the corresponding group of control signals, and the reading selection voltage;

output signals of the last group of data selectors are output to the anti-fuse unit corresponding to the storage data address to control the execution of programming or reading operations.

19. The voltage control circuit for an anti-fuse memory array according to claim 18, wherein a process that each group of control signals controls a corresponding group of data selectors is:

when a control signal is a low level, a data selector corresponding to the control signal outputs one output signal of one data selector in the previous group of data selectors, the programming selection voltage, or the reading selection voltage; when the control signal is the programming selection voltage or the reading selection voltage, the data selector corresponding to the control signal outputs the non-designated selection voltage or the reading selection voltage.

20. The voltage control circuit for an anti-fuse memory array according to claim 18, wherein each data selector comprises a first PMOS transistor and a second PMOS transistor, wherein a gate of the first PMOS transistor is connected to a corresponding control signal, and a source of the first PMOS transistor is connected to one of the output signals of a previous group of data selectors or the programming selection voltage or the reading selection voltage;

a gate of the second PMOS transistor is connected to an inverse signal of the control signal connected to the gate of the first PMOS transistor, and a source of the second PMOS transistor is connected to the non-designated selection voltage or the reading selection voltage;

a drain of the first PMOS transistor and a drain of the second PMOS transistor are connected to each other to act as an output end of the data selector.

* * * * *